United States Patent
Hsiang et al.

(10) Patent No.: US 9,656,867 B2
(45) Date of Patent: May 23, 2017

(54) METHOD OF SYNTHESIZING COPPER SELENIDE POWDER

(71) Applicants: Hsing-I Hsiang, Tainan (TW); Chang-Ting Yang, Tainan (TW); Jui-Huan Tu, Tainan (TW); Juu-En Chang, Tainan (TW)

(72) Inventors: Hsing-I Hsiang, Tainan (TW); Chang-Ting Yang, Tainan (TW); Jui-Huan Tu, Tainan (TW); Juu-En Chang, Tainan (TW)

(73) Assignee: NATIONAL CHENG KUNG UNIVERSITY, Tainan (TW)

( * ) Notice: Subject to any disclaimer, the term of this patent is extended or adjusted under 35 U.S.C. 154(b) by 51 days.

(21) Appl. No.: 14/639,988

(22) Filed: Mar. 5, 2015

(65) Prior Publication Data

US 2016/0257567 A1 Sep. 8, 2016

(51) Int. Cl.
*C01B 17/00* (2006.01)
*C01B 19/00* (2006.01)
*H01L 21/02* (2006.01)

(52) U.S. Cl.
CPC ........ *C01B 19/007* (2013.01); *C01P 2002/72* (2013.01); *C01P 2002/82* (2013.01); *C01P 2002/84* (2013.01); *C01P 2002/85* (2013.01); *C01P 2004/03* (2013.01); *C01P 2004/04* (2013.01); *H01L 21/02568* (2013.01); *H01L 21/02601* (2013.01)

(58) Field of Classification Search
CPC ... C01B 19/007; C01B 19/00; H01B 21/0256; H01B 31/0272
See application file for complete search history.

(56) References Cited

U.S. PATENT DOCUMENTS 6,379,585 B1 * 4/2002 Vecht ..................... C01B 17/20
252/301.35

FOREIGN PATENT DOCUMENTS

CN 103466564 A * 12/2013

OTHER PUBLICATIONS

Well-Dispersed, Plate-Shaped Cu2-xSe Nanocrytals by Ambient-Pressure Triethylene Glycol-Based Solution Synthesis. Wang et al., Science of Advanced Materials, vol. 5, [[. 668-676, 2013.*
Machine translation of CN103466564A, 2015.*

* cited by examiner

*Primary Examiner* — Khanh Tuan Nguyen
*Assistant Examiner* — Haidung Nguyen

(57) ABSTRACT

This present invention relates to a method of synthesizing copper selenide powder by using a hot-injection method wherein a proper amount of a reducing agent is added to a mixed solution made of copper cationic solution and selenium anionic solution, and the mixed solution is maintained at a temperature of 230° C. for 40 minutes to obtain Copper Selenide powder. The Copper selenide powder, which is in the form of CuSe or $Cu_{2-x}Se$, can be synthesized by adjusting the amount of the reducing agent being added to the mixed solution.

1 Claim, 10 Drawing Sheets

METHOD OF SYNTHESIZING COPPER SELENIDE POWDER

BACKGROUND OF THE INVENTION

1. Fields of the Invention

This present invention relates to a method of synthesizing copper selenide powder and more particularly, to a method, which employs a very weak chelating agent to chelate copper and selenium ions and which comprises injecting a copper ion solution instantly into a selenium solution to form a mixed solution at a certain temperature and adding quickly a proper amount of reducing agent into the mixed solution for obtaining copper selenide powder.

2. Descriptions of Related Art

Copper selenide is one of the most important materials for p-type semiconductors and has been applied widely in industry for making solar cell, gas sensor, super ionic conductor and thermoelectric converter.

Copper selenide, however, exists in a stoichiometric form, such as $CuSe)$, $CuSe$, $Cu_2Se$, $Cu_3Se_2$, or in a non-stoichiometric form, such as $Cu_{2-x}Se$.

Yet, literatures and documents have not revealed that the synthesis of $Cu_{2-x}Se$ and CuSe powder can be achieved merely by adjusting the dosage of one reducing agent.

By using hot-injection method, copper chloride is dissolved in TEG (triethylene glycol) in order to achieve cationic precursor and selenium powder is mixed with TEG and PVP (polyvinylpyrrolidone) in order to obtain anionic precursor. Then the cationic precursor is instantly injected into the anionic precursor solution and then adding 0.005 ml of TETA (triethylenetetramine) under a temperature of 210° C. Thereafter, the temperature of the solution would be maintained at 210° C. for 45 minutes and then cooled to 80° C. The Pyrite-CuSe2 powder can be produced after being repeatedly centrifuged and washed by ethanol. (T. Liu, Z. Jin, J. Li, J. Wang, D. Wang, J. Lai and H. Du, "Monodispersed octahedral-shaped pyrite CuSe2 particles by polyol solution chemical synthesis," CrystEngComm 15 (2013), 8903-8906)

In ion exchange process, selenium powder is mixed thoroughly with deionized water, 1M of sodium hydroxymethanesulfinate and 2M of ammonium hydroxide until the solution is clear in order to obtain an anionic precursor. Then, the anionic precursor is added into 0.3M of copper nitrate solution as a cationic precursor and stirred at 25° C. until the solution being black and some precipitates having appeared. The precipitates are then centrifuged with ultra pure water repeatedly to obtain CuSe. (O. Arellano-Tánori, M. C. Acosta-Enriquez, R. Ochoa-Landin, R. Iñiguez-Palomares, T. Mendivil-Reynoso, M. Flores-Acosta, S. J. Castillo, "Copper-Selenide And Copper-Telluride Composites Powders Sintetized By Ionic Exchange" Chalcogenide Letters (2014), 13-19.)

Alternatively, cationic precursor can be obtained by mixing copper chloride and ethylenediamine at room temperature for 10 minutes. Anionic precursor can be obtained by mixing selenium powder and hydrazine at room temperature for 10 minutes. Then, the cationic precursor is injected into the anionic precursor solution instantly. The mixed solution is stirred at room temperature until the brown precipitates having appeared. Then, the precipitates are centrifuged with ultra pure water to obtain Cu, Se powder. (P. Hu, Y. Cao, Synthesis of rod and lath-shaped CuSe and tremella-shaped $Cu_{2-x}Se$ nanostructures at room temperature, and their optical properties" J Nanopart Res (2012) 1-8)

In view of the foregoing, it is known that the synthesis of CuSe or $Cu_{2-x}Se$ powder could be done by using various chelating agents under different reaction conditions, sometimes even using toxic chemicals such as hydrazine, which is dangerous and may be harmful to the environment.

SUMMARY OF THE INVENTION

One object of the present invention is to provide a method of synthesizing cupper selenide powder in the form of CuSe and $Cu_{2-x}Se$ easily, with more safety and less pollution.

The steps of the method of synthesizing copper selenide powder may comprise: preparing 160 ml of TEG (Triethylene glycol) solvent being added with 2 mmol of selenium powder and 0.4 g of PVP (polyvinylpyrrolidone) in a three-necked flask, which is heated up to a temperature of 230° C. and maintained at the temperature for 1 hour in order to obtain an anionic solution; preparing 20 ml of TEG solvent being added with 0.5 mmol of copper (II) acetate, which is reacted at 100° C. for 1 hour in order to obtain a cationic solution; injecting the cationic solution instantly into the anionic solution to obtain a mixed solution and then adding TETA (triethylenetetramine) as reducing agent by dosages between 0.2-2.2 ml to the mixed solution, which is maintained at 230° C. for 40 minutes and then cooled to 60° C.; adding ethanol into the mixed solution in order to terminate the reaction; centrifuging the mixing solution to obtain powder; and washing the powder repeatedly with ethanol to remove byproducts and drying the powder as so to obtain CuSe and $Cu_{2-x}Se$ powder.

According to one feature of the present invention, CuSe powder can be obtained by adding a smaller amount of the TETA, such as 0.7 ml, to the mixed solution, while $Cu_{2-x}Se$ powder can be obtained by adding a large amount of the TETA, such as 2.2 ml, to the mixed solution.

According to another feature of the present invention, the initial molar ratio of copper to selenium is about 1:4.

One advantage of the present invention is that the method of making the product of CuSe or $Cu_{2-x}Se$ powder can be simplified, with more safety and less pollution.

DETAILED DESCRIPTION OF THE PREFERRED EMBODIMENT

In order that those skilled in the art can further understand the present invention, a description will be provided in the following in detail. However, these descriptions and the drawings are used to cause those skilled in the art to understand the objects, features, and characteristics of the present invention, but not to be used to confine the scope and spirit of the present invention defined in the appended claims.

Figure 1:
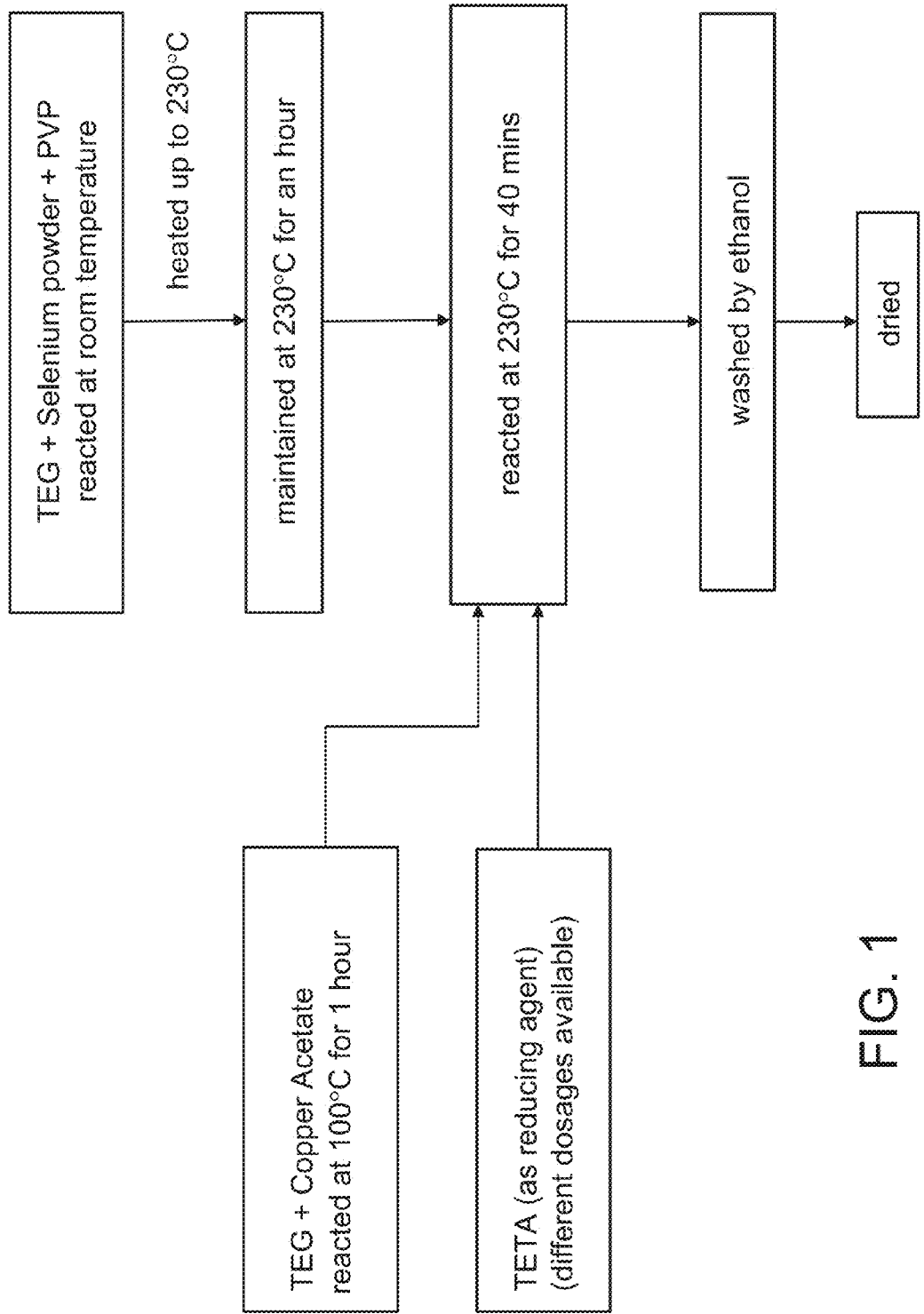
FIG. 1 is a process flow chart of the present invention.

FIG. 1 shows a flowchart of an embodiment of the present invention, wherein 160 ml of TEG (triethylene glycol) solvent being added with 2 mmol of selenium powder and 0.4 g of PVP (polyvinylpyrrolidone) in a three-necked flask is heated up and maintained at a temperature of 230° C. for 1 hour in order to obtain an anionic solution. In the meantime, 20 ml of TEG solvent being added with 0.5 mmol of copper (II) acetate is maintained at the temperature of 100° C. for 1 hour in order to obtain an cationic solution. The initial molar ratio of copper to selenium is 1:4. After the copper (II) acetate and the selenium powder are respectively, completely dissolved in the two solutions, the cationic solution is injected instantly into the anionic solution to obtain a mixed solution or reaction solution, which is added with TETA (triethylenetetramine). The amount of TETA used in this embodiment includes 0.2 ml, 0.4 ml, 0.7 ml, 1.6 ml, 1.8 ml, 2.0 ml, and 2.2 ml. Then the mixed solution is heated up and maintained at a temperature of 230° C. for 40 minutes. After the reaction is completed, the solution is cooled to 60° C. and then, 160 ml of ethanol is added to the solution to terminate the reaction. Powder can be obtained by centrifuging at 6000 rpm for 5 minutes and then byproducts in the powder can be washed by using ethanol and dried repeatedly so as to achieve copper selenide powder.

Figure 2:
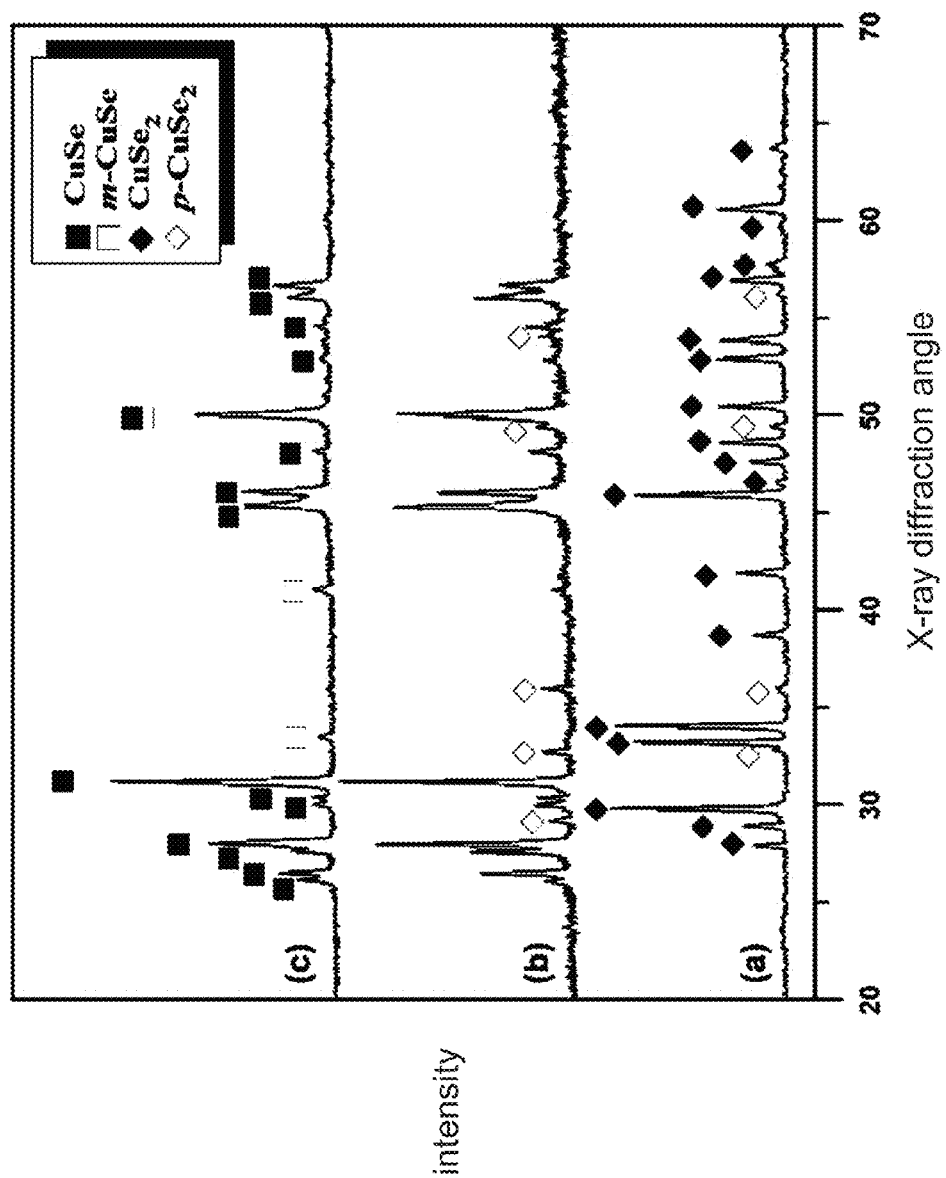
FIG. 2 is an XRD pattern of CuSe powder of the present invention.

FIG. 2 shows different XRD (X-Ray Diffraction) patterns of copper selenide synthesized in different amounts of TETA: (a) 0.2 ml, (b) 0.4 ml and (0) 0.7 ml, respectively. It is observed that the product synthesized with 0.7 ml TETA contains two crystalline structures, including orthorhombic crystal of CuSe (major part of the product) and monoclinic crystal of CuSe (minor part of the product).

It is clear from the above-mentioned results that the product of $CuSe_2$ is gradually transformed into the product of CuSe with the increasing dosage of TETA. The Se is slightly reduced to $Se_2^{2-}$ and thus CuSe, is the main product due to the weak reducing potential if the dosage of TETA is set to 0.2 ml. In another condition, most Se is reduced to $Se^{2-}$ and thus the CuSe is the main product due to the increased reducing potential if the dosage of TETA is raised to 0.4 ml. All Se is reduced to $Se^{2-}$ and thus only CuSe is the product because of the strong reducing potential if the dosage of TETA is set to 0.7 ml.

Figure 3:
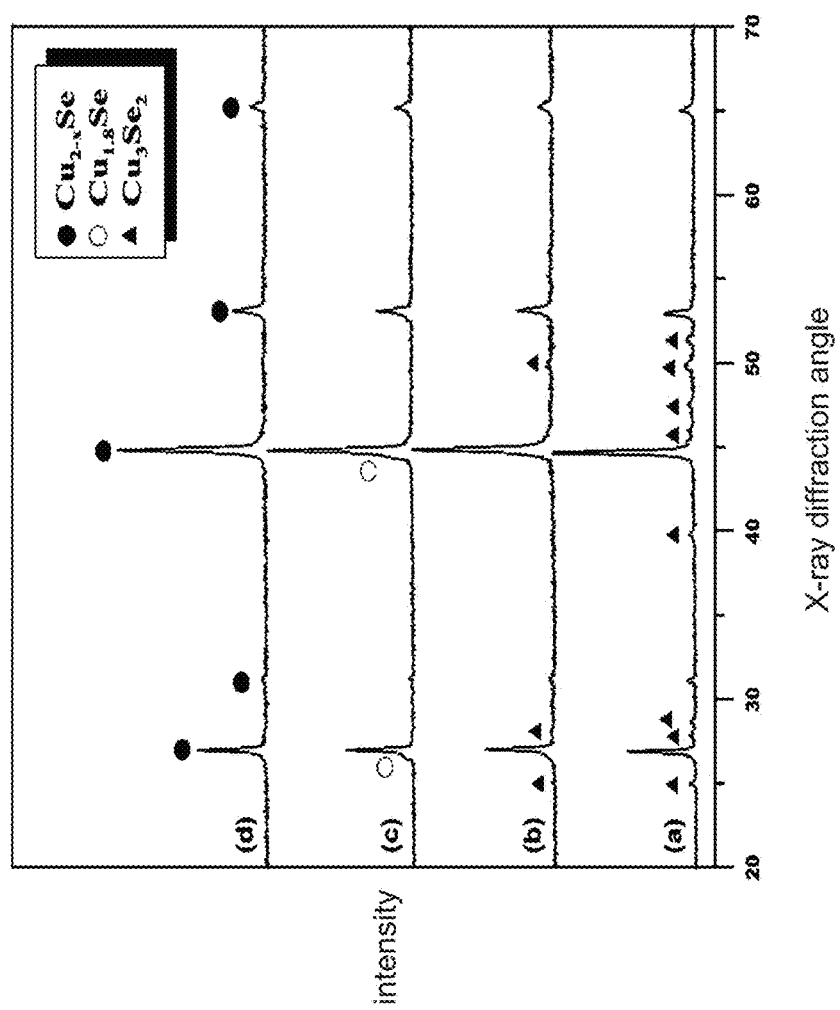
FIG. 3 is an XRD pattern of $Cu_{2-x}Se$ powder of the present invention.

FIG. 3 shows different XRD patterns of copper selenide synthesized in different amounts of TETA: (a) 1.6 ml, (b) 1.8 ml, (c) 2.0 ml and (d) 2.2 ml, respectively. It is observed that the products synthesized with 1.6 ml and 1.8 ml TETA are formed into a tetragonal crystal of $Cu_3Se_2$; the product synthesized with 2.0 ml TETA is formed into a cubic crystal of $Cu_{1.8}Se$; the product synthesized with 2.2 ml TETA is formed into a cubic crystal of cubic $Cu_{2-x}Se$.

The electron of copper begins to shift when the dosage of TETA is raised to 1.6 ml and 1.8 ml. The increased reduction potential leads to the reaction of $Cu^{2+} \rightarrow Cu^{1+}$ and the product of CuSe is thus partially converted to $Cu_3Se_2$. As the amount of TETA is raised from 0.7 ml to 1.6 ml or 1.8 ml, due to the increased reduction potential of TETA, the electron of elemental copper begins to shift to cause the reaction: $Cu^{2+} \rightarrow Cu^{1+}$, and thus the product of CuSe, which can be synthesized with 0.7 ml TETA, is partially converted to $Cu_3Se_2$.

Figure 4:
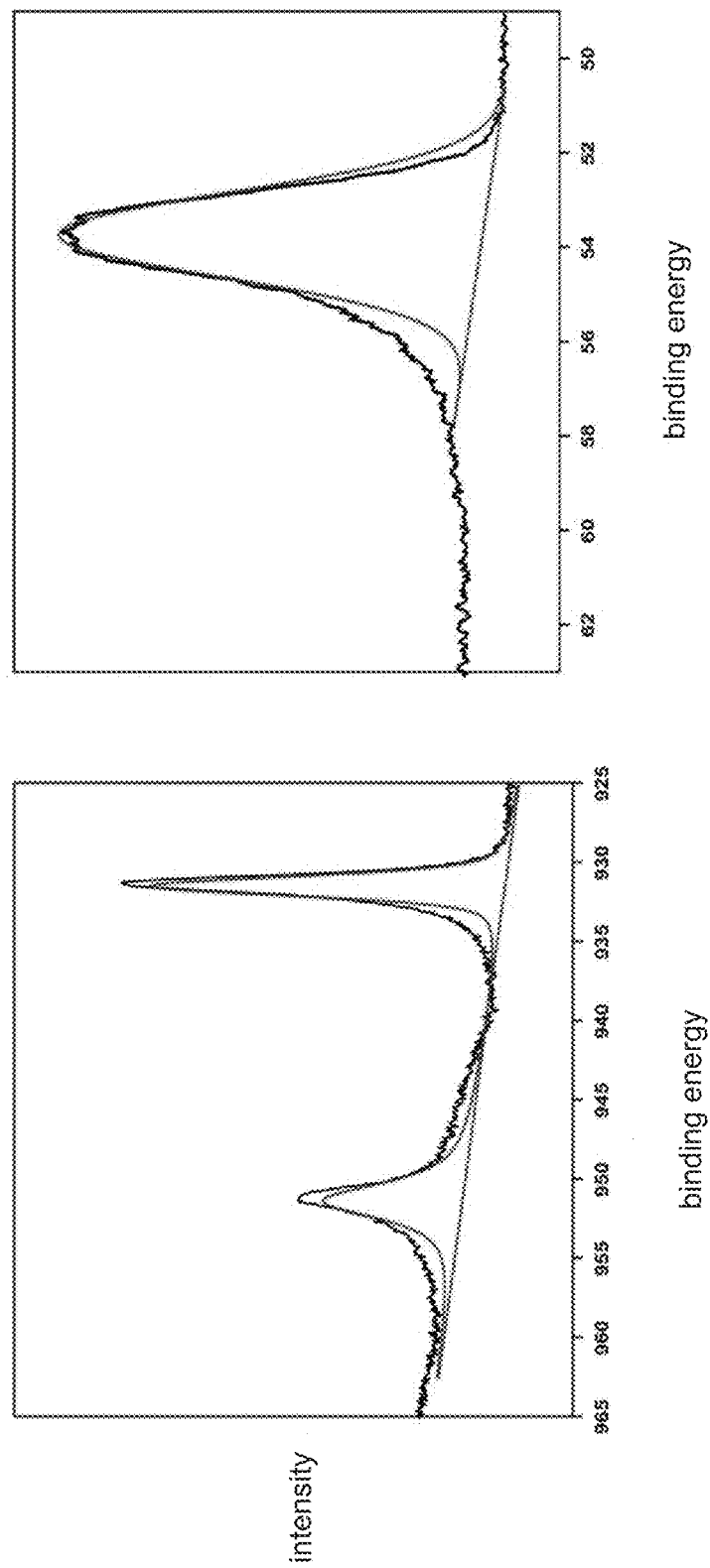
FIG. 4 is an XPS spectrum of CuSe powder of the present invention.

FIG. 4 shows XPS (X-ray Photoelectron Spectroscopy) spectrum for the product synthesized with 0.7 ml TETA. It is indicated that the binding energy of Cu $2_{p3/2}$ is 931.56 eV, and the binding energy of Se 3d is 53.78 eV. This confirms that the product synthesized with 0.7 ml is CuSe.

Figure 5:
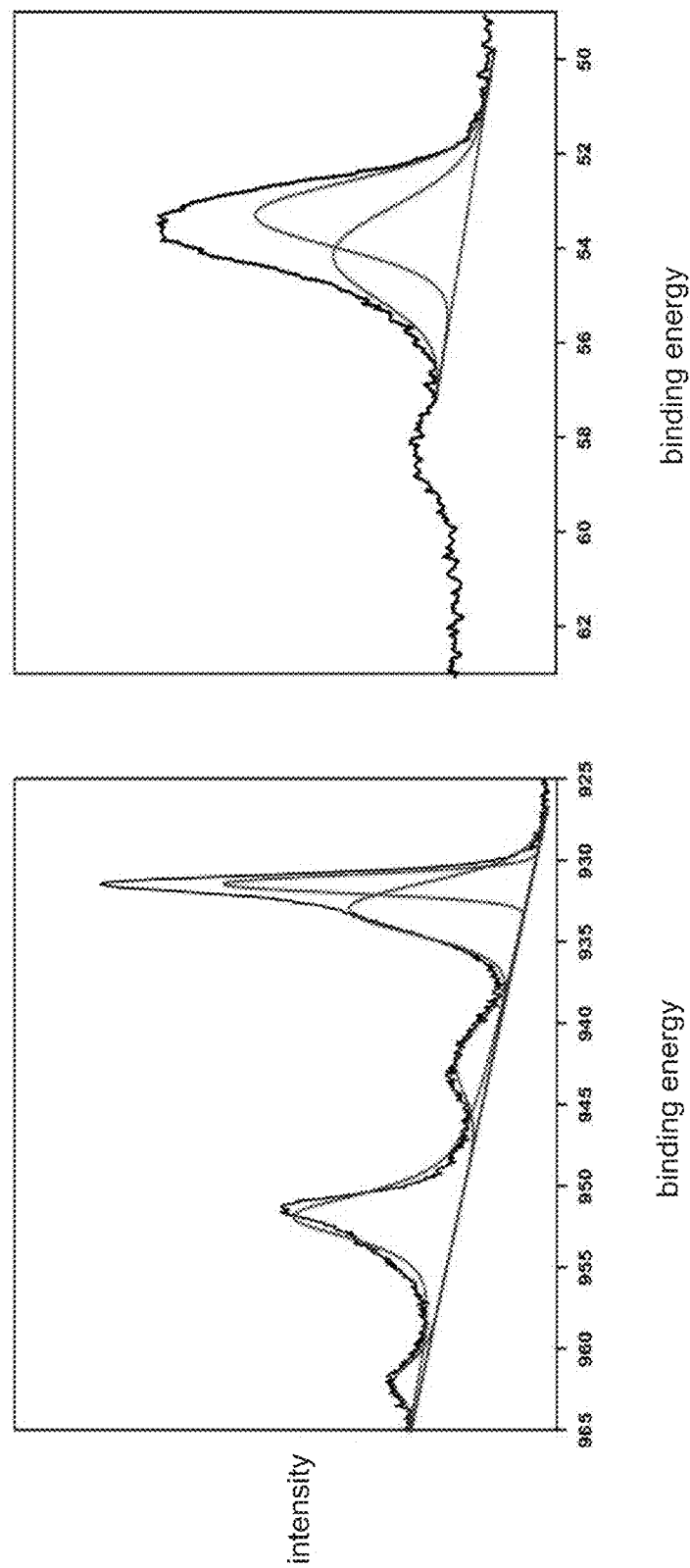
FIG. 5 is an XPS spectrum of $Cu_{2-x}Se$ powder of the present invention.

FIG. 5 shows XPS spectrum for the product synthesized with 2.2 ml TETA. It is indicated that the binding energy of Cu $2_{p3/2}$, Cu $2_{p1/2}$, Se $3_{d5/2}$ and Se $3_{d3/2}$ are 931.46 eV-951.87 eV-53.34 eV-54.15 eV, respectively.

It is thereby apparent that the product synthesized with 2.2 ml TETA is $Cu_{2-x}Se$, and most Cu is reduced to $Cu^{1+}$ and most Se is reduced to $Se^{2-}$.

It is concluded that the valences of elemental copper and selenium of the copper selenide synthesized in the mixed solution depend on the amount of TETA being added.

Figure 6:
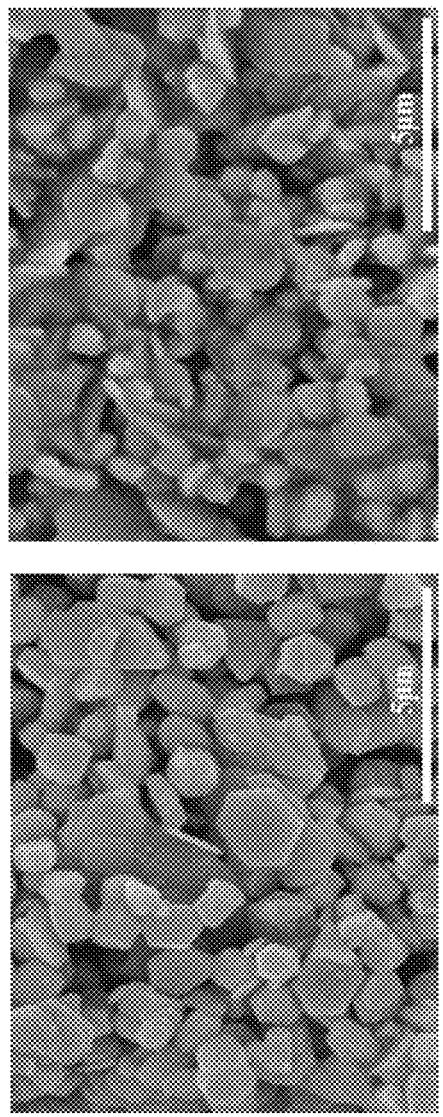
FIG. 6 shows SEM images of CuSe and $Cu_{2-x}Se$ powder of the invention.

FIG. 6 shows that the SEM (Scanning Electron Microscopy) images of the CuSc and $Cu_{2-x}Se$ powder, which are synthesized, through a hot-injection method, respectively by adding 0.7 ml and 2.2 ml of TETA at the temperature 230° C. for 40 minutes. The image of the CuSe powder, which is obtained by adding 0.7 ml TETA to the mixed solution, generally shows hexagonal flake-like crystalline structures, wherein the particle size is between 0.4 and 3 μm. The image of the $Cu_{2-x}Se$ powder, which is obtained by adding 2.2 ml TETA to the mixed solution, generally shows hexagonal flake-like crystalline structures, wherein the particle size is between 0.4 and 3 μm. It is observed that both of the powder products have almost the same particle size.

Figure 7:
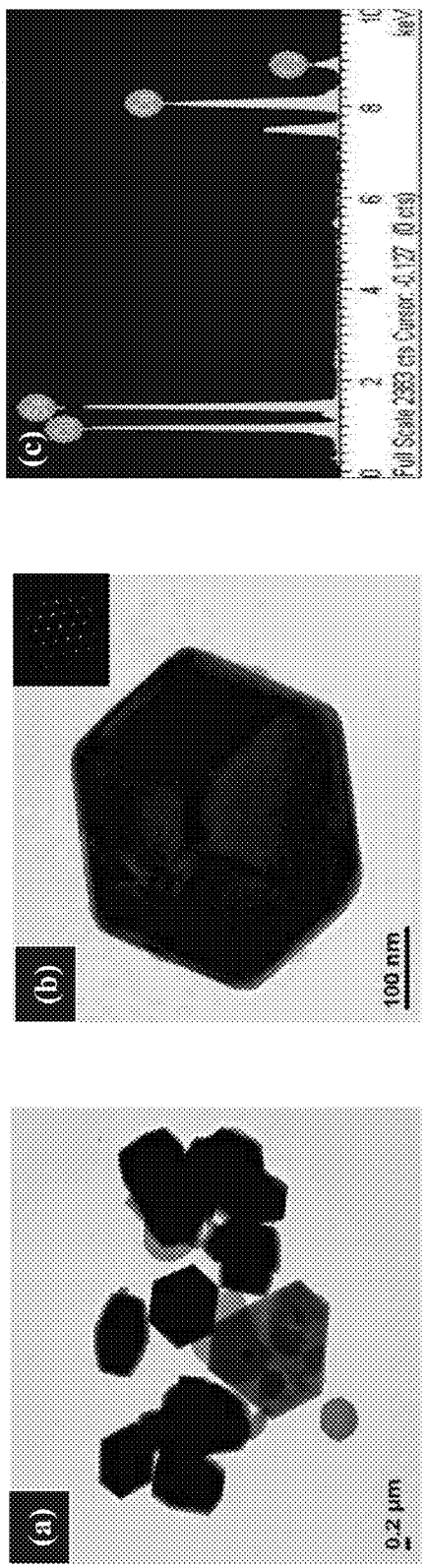
FIG. 7 shows TEM images of CuSe powder of the present invention.

FIG. 7 shows TEM (Transmission Electron Microscopy) images of the product synthesized with 0.7 ml TETA and the associated EDS (Energy Dispersive X-Ray Spectroscopy) analysis, wherein hexagonal, flake-like crystalline structures, with a particle size between 0.8 and 2 μm, are formed. The EDS analysis shows that the Cu/Se atomic ratio of the crystalline structures is about 53.4/46.6, and this confirms that the product is CuSe.

Figure 8:
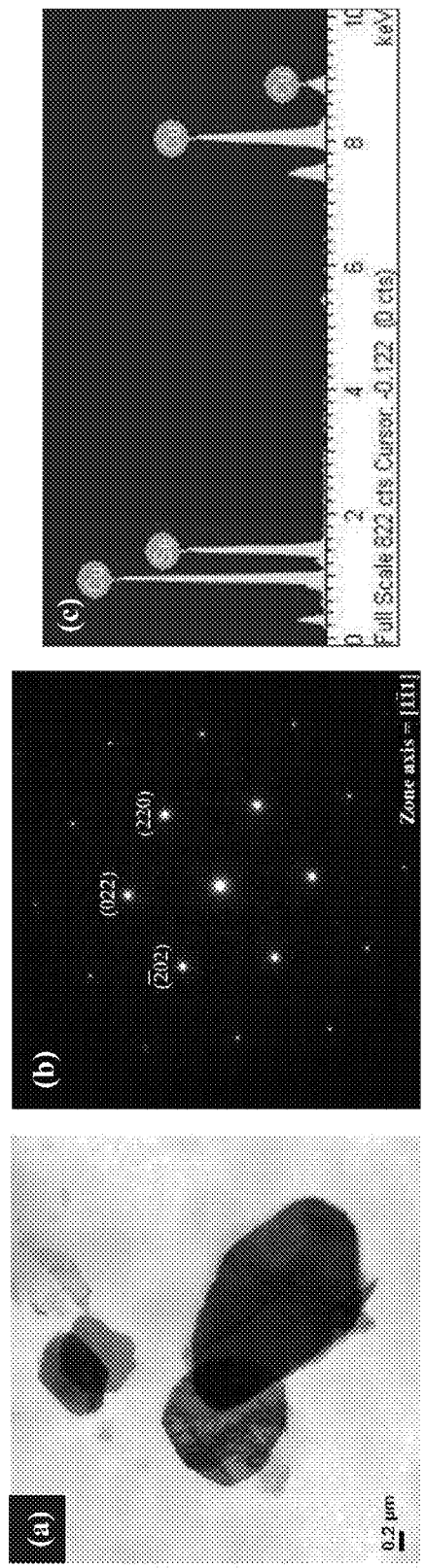
FIG. 8 shows a TEM image of $Cu_{2-x}Se$ powder of the present invention.

FIG. 8 shows a TEM image of the powder synthesized by adding 2.2 ml of the TETA and the associated EDS analysis. The crystallization morphology of the powder shows nearly hexagonal flake-like crystalline structures, with a particle size between 0.8 and 3 μm. The powder analyzed by selective area diffraction shows that the d-value obtained from the analysis corresponds to crystal planes (202), (022) and (220) of cubic $Cu_{2-x}Se$. The EDS analysis shows that Cu/Se atomic ratio of the product is about 62.61/37.39. These test results confirm that the powder is $Cu_{2-x}Se$.

Figure 9:
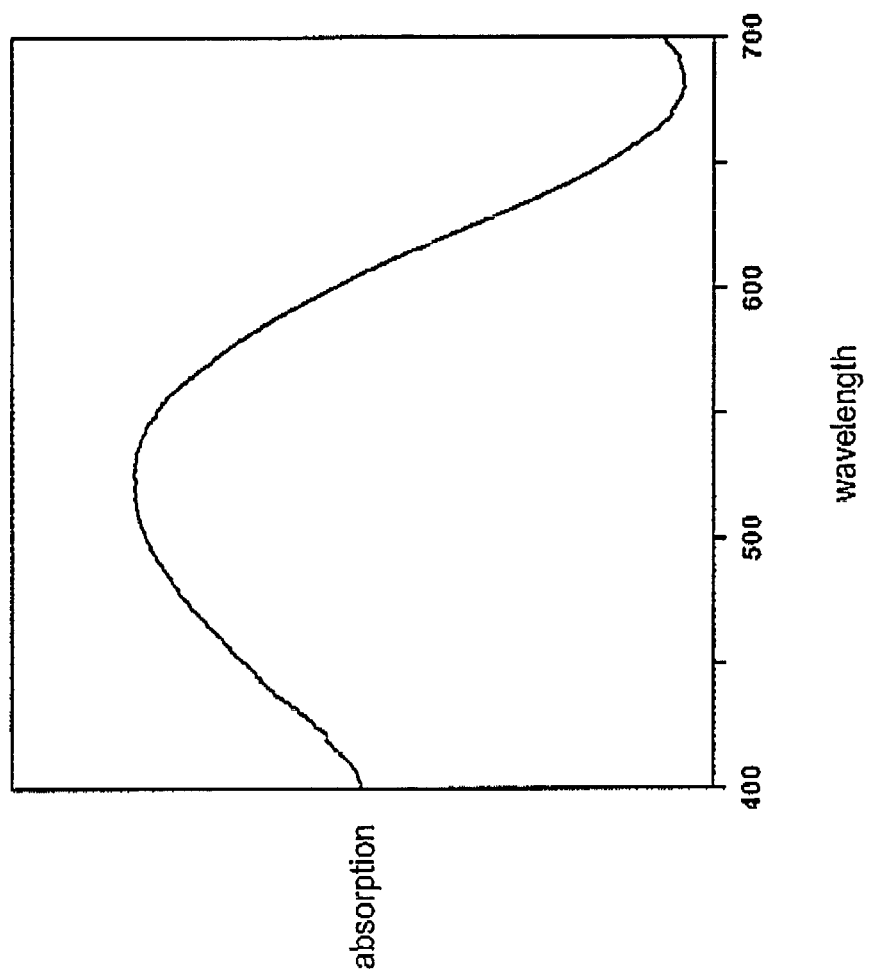
FIG. 9 is a UV-Vis absorption spectrum of CuSe powder of the present invention.

Further, FIG. 9 shows a UV-visible absorption spectrum of the CuSe product, wherein the absorption band is in the wavelength range of 450-650 nm. An absorption wavelength of 595 nm, equivalent to an energy gap of 2.08 eV, can be obtained by making a tangent to the curve.

Figure 10:
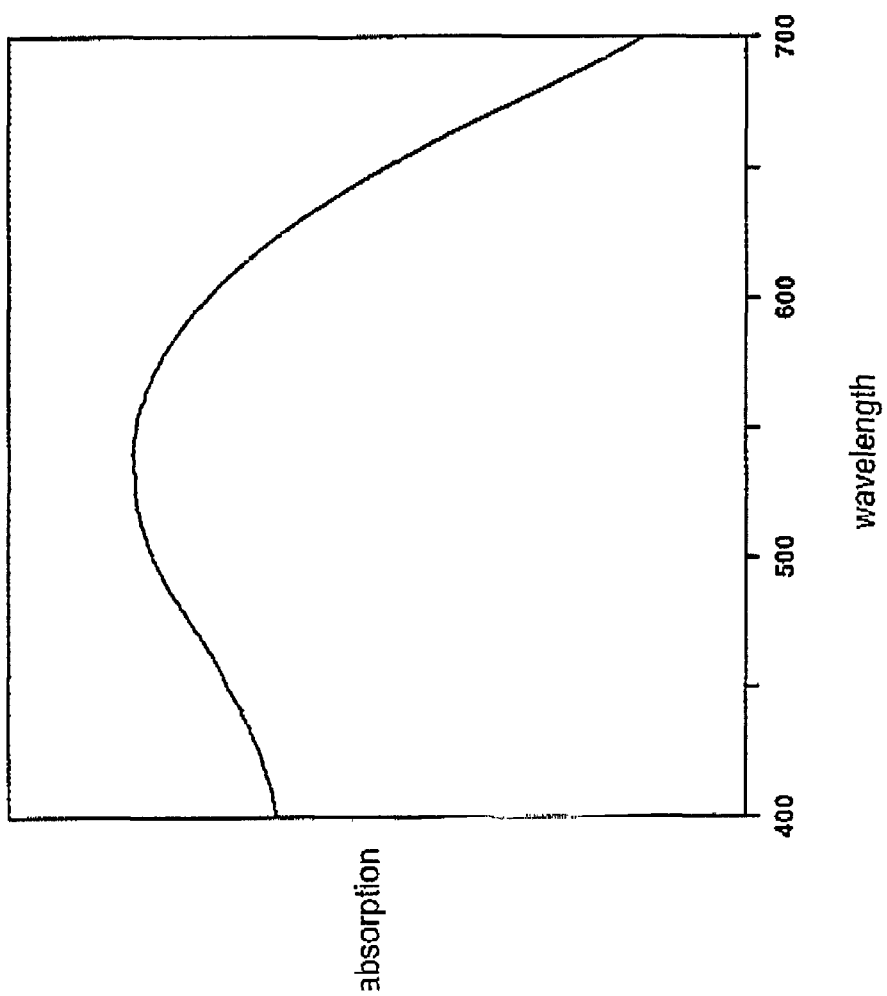
FIG. 10 is a UV-Vis absorption spectrum of $Cu_{2-x}Se$ powder of the present invention.

Additionally, FIG. 10 shows a UV-visible absorption spectrum of the $Cu_{2-x}Se$ product, wherein the absorption band is in the wavelength range of 450-600 nm. An absorption wavelength of 560 nm, equivalent to an energy gap of 2.22 eV, can be obtained by making a tangent to the curve.

While the preferred embodiment of the invention has been described above, it will be recognized and understood that various modifications may be made therein and the appended claims are intended to cover all such modifications that may fall within the spirit and scope of the invention.

What is claimed is:
1. A method of synthesizing copper selenide powder, which comprises:
putting an amount of selenium powder and PVP into a three-neck flask containing TEG to form a first TEG solution, and maintaining the first TEG solution at a temperature of 230° C. for 1 hour, wherein the first TEG solution contains about 2 mmol selenium per 160 ml TEG;

putting an amount of copper (II) acetate into a container having TEG to form a second TEG solution, and maintaining the second TEG solution at a temperature of 100° C. for 1 hour, wherein the second TEG solution contains about 0.5 mmol copper per 20 ml TEG, and the amount of the copper (II) acetate is prepared such that the molar ratio of copper to selenium is about 1:4;

injecting the second TEG solution into the three-neck flask containing the first TEG solution to obtain a reaction solution, which is added with TETA and maintained at a temperature of 230° C. for 40 minutes and then cooled down to a temperature of 60° C.;

adding ethanol to terminate reaction in the reaction solution;

removing water from the reaction solution by centrifugal force to obtain copper selenide powder; and washing the copper selenide powder by ethanol; wherein the copper selenide powder is in a crystalline form of CuSe when the volume ratio of the TETA to the TEG used in the reaction solution is about 0.7 ml/180 ml; the copper selenide powder is in a crystalline form of $Cu_{2-x}Se$ when the volume ratio of the TETA to the TEG used in the reaction solution is about 2.2 ml/180 ml.

* * * * *